US010763199B2

(12) United States Patent
Shih (10) Patent No.: US 10,763,199 B2
(45) Date of Patent: Sep. 1, 2020

(54) SEMICONDUCTOR PACKAGE STRUCTURE AND METHOD FOR PREPARING THE SAME

(71) Applicant: NANYA TECHNOLOGY CORPORATION, New Taipei (TW)

(72) Inventor: Shing-Yih Shih, New Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/268,836

(22) Filed: Feb. 6, 2019

(65) Prior Publication Data

US 2020/0203267 A1 Jun. 25, 2020

Related U.S. Application Data

(60) Provisional application No. 62/784,613, filed on Dec. 24, 2018.

(51) Int. Cl.
| | | |
|---|---|---|
| H01L 23/49 | (2006.01) | |
| H01L 23/52 | (2006.01) | |
| H01L 23/498 | (2006.01) | |
| H01L 23/31 | (2006.01) | |

(52) U.S. Cl.
CPC .... H01L 23/49827 (2013.01); H01L 23/3171 (2013.01); H01L 23/3192 (2013.01); H01L 23/49811 (2013.01); H01L 23/49822 (2013.01)

(58) Field of Classification Search
CPC ........... H01L 23/49827; H01L 23/3171; H01L 23/3192; H01L 23/49811; H01L 23/49822
USPC ........................................................ 257/774
See application file for complete search history.

(56) References Cited

U.S. PATENT DOCUMENTS

| 8,987,050 | B1* | 3/2015 | Hiner ................ H01L 23/49838 |
| | | | 257/E21.499 |
| 9,484,325 | B2 | 11/2016 | Uzoh |
| 9,589,857 | B2 | 3/2017 | Liu et al. |
| 2004/0063246 | A1* | 4/2004 | Karnezos .............. H01L 23/552 |
| | | | 438/108 |

(Continued)

FOREIGN PATENT DOCUMENTS

| CN | 103247600 A | 8/2013 |
| TW | 200849422 A | 12/2008 |
| TW | 201820495 A | 6/2018 |

OTHER PUBLICATIONS

Notice of Allowance dated Mar. 27, 2020 related to Taiwanese Application No. 108106780.

*Primary Examiner* — Sheikh Maruf (74) *Attorney, Agent, or Firm* — Muncy, Geissler, Olds & Lowe, P.C.

(57) ABSTRACT

The present disclosure provides a semiconductor package structure. The semiconductor package structure includes a substrate having a front surface and a back surface opposite to the front surface, an interconnection structure disposed over the front surface of the substrate, a first passivation layer disposed over the back surface of the substrate, a second passivation layer disposed over the first passivation layer, and a TSV disposed in the substrate. In some embodiments, the TSV structure penetrates the substrate from the back surface of the substrate to the front surface of the substrate. In some embodiments, the TSV has an end portion protruding from the first passivation layer and separated from the second passivation layer.

11 Claims, 11 Drawing Sheets

(56) References Cited

U.S. PATENT DOCUMENTS

| | | | | |
|---|---|---|---|---|
| 2004/0245623 A1* | 12/2004 | Hara | H01L 23/481 | 257/698 |
| 2007/0164349 A1* | 7/2007 | Nakasato | H01L 21/6835 | 257/318 |
| 2008/0277799 A1* | 11/2008 | Benson | H01L 31/02327 | 257/774 |
| 2010/0032811 A1* | 2/2010 | Ding | H01L 21/76898 | 257/621 |
| 2010/0173455 A1* | 7/2010 | Shiota | H01L 21/561 | 438/113 |
| 2010/0276787 A1* | 11/2010 | Yu | H01L 25/50 | 257/621 |
| 2011/0104888 A1* | 5/2011 | Kim | H01L 25/105 | 438/637 |
| 2011/0241202 A1* | 10/2011 | Liu | H01L 23/552 | 257/E23.021 |
| 2012/0061823 A1* | 3/2012 | Wu | H01L 23/3157 | 257/737 |
| 2012/0313258 A1* | 12/2012 | Kitada | H01L 24/14 | 257/774 |
| 2013/0026618 A1* | 1/2013 | Chen | H01L 23/3192 | 257/737 |
| 2014/0035127 A1* | 2/2014 | Hirtreiter | H01L 24/11 | 257/737 |
| 2014/0048952 A1* | 2/2014 | Lee | H01L 21/76898 | 257/774 |
| 2014/0252597 A1* | 9/2014 | Tsai | H01L 23/3171 | 257/737 |
| 2014/0264837 A1* | 9/2014 | Chen | H01L 23/3171 | 257/737 |
| 2015/0014851 A1* | 1/2015 | Lu | H01L 21/566 | 257/738 |
| 2015/0170995 A1* | 6/2015 | Chen | H01L 24/11 | 257/774 |
| 2015/0179610 A1* | 6/2015 | Khan | H01L 21/4828 | 257/676 |
| 2017/0053882 A1* | 2/2017 | Jin | H01L 25/117 | |
| 2017/0084529 A1* | 3/2017 | Hsieh | H01L 23/522 | |
| 2017/0213801 A1* | 7/2017 | Wu | H01L 2402/02 | |

* cited by examiner

SEMICONDUCTOR PACKAGE STRUCTURE AND METHOD FOR PREPARING THE SAME

PRIORITY DATA

This application claims the priority benefit of U.S. provisional patent application Ser. No. 62/784,613 filed on Dec. 24, 2018. The entirety of the above-mentioned patent application is hereby incorporated by reference herein and made a part of this specification.

TECHNICAL FIELD

The present disclosure relates to a semiconductor package structure and a method for preparing the same, and more particularly, to a semiconductor package structure including a through silicon via (TSV) and a method for preparing the same.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Due to the miniaturized scale of semiconductor devices, chip-on-chip technique is now widely used for manufacturing semiconductor packages.

In one approach, using a stack of at least two chips (or dies), in a 3D package to form, for example, a memory device, it is possible to produce a product having a memory capacity which is twice as large as that obtainable through other semiconductor integration processes. In addition to the increase in memory capacity, a stack package also provides improved mounting density and mounting area utilization efficiency. Due to such advantages, research and development of stack package technology has accelerated.

One type of a stack package using a through-silicon via (TSV) has been disclosed in the art. The stack package using a TSV has a structure in which the TSV is disposed in a chip so that chips are electrically connected to each other through the TSV. Generally, a TSV is formed by etching a vertical via through a substrate and filling the via with a conductive material, such as copper (Cu). Usually, vertical vias formed through the substrate have a same depth and are aligned with pads formed in the chip. Further, specific routing lines are designed and formed to serve as the terminals on which the TSVs are disposed. However, such specific routing lines complicate the circuit design, especially in dual-die stacking.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor package structure. The semiconductor package structure includes a substrate having a front surface and a back surface opposite to the front surface, an interconnection structure disposed over the front surface of the substrate, a first passivation layer disposed over the back surface of the substrate, a second passivation layer disposed over the first passivation layer, and a TSV disposed in the substrate. In some embodiments, the TSV structure penetrates the substrate from the back surface of the substrate to the front surface of the substrate. In some embodiments, the TSV has an end portion protruding from the first passivation layer and separated from the second passivation layer.

In some embodiments, a length of the TSV is greater than a thickness of the substrate.

In some embodiments, a difference between the length of the TSV and the thickness of the substrate is between approximately 1 micrometer and approximately 10 μm.

In some embodiments, the TSV is electrically connected to the interconnection structure.

In some embodiments, the semiconductor package structure further includes a first connecting structure disposed over the interconnection structure.

In some embodiments, the first passivation layer is in contact with a portion of sidewalls of the TSV.

In some embodiments, a step height is defined by a surface of the end portion of the TSV and a top surface of the first passivation layer.

In some embodiments, the semiconductor package structure further includes a second connecting structure disposed over the second passivation layer and the TSV.

In some embodiments, the semiconductor package structure further includes a metallic layer disposed between the TSV and the second connecting structure.

In some embodiments, the metallic layer and the second connecting structure surround the end portion of the TSV.

One aspect of the present disclosure provides a method for preparing a semiconductor package structure. The method includes the following steps. A substrate is provided. In some embodiments, the substrate includes a TSV embedded therein. The substrate has a front surface and a back surface opposite to the front surface. A portion of the substrate is removed to expose the TSV through the back surface. In some embodiments, the TSV includes a first end portion exposed through and protruding from the back surface of the substrate. A first passivation layer is disposed over the back surface of the substrate. In some embodiments, the TSV includes a second end portion exposed through and protruding from the first passivation layer. A second passivation layer is disposed over the first passivation layer. In some embodiments, the second passivation layer has a stair-step opening, and the second end portion of the TSV is exposed through the stair-step opening. A first connecting structure is disposed in the stair-step opening.

In some embodiments, the method further includes disposing an interconnection structure and a second connecting structure over the front surface of the substrate.

In some embodiments, the removing of the portion of the substrate further includes the following steps. The substrate is thinned from the back surface such that a surface of the TSV and the back surface are coplanar. The substrate is then etched back from the back surface to expose the first end portion of the TSV.

In some embodiments, a first step height is defined by a surface of the first end portion and the back surface of the substrate after the removing of the portion of the substrate.

In some embodiments, the first step height is between approximately 1 micrometer and approximately 10 μm.

In some embodiments, the disposing of the first passivation layer further includes the following steps. The first passivation layer is disposed conformally over the back surface of the substrate. A portion of the first passivation layer is removed to expose the second end portion of the TSV.

In some embodiments, a second step height is defined by a surface of the second end portion and a top surface of the first passivation layer.

In some embodiments, the disposing of the second passivation layer further includes the following steps. The second passivation layer is disposed over the back surface of the substrate. A portion of the second passivation layer is removed to form the stair-step opening.

In some embodiments, the method further includes disposing a metallic layer prior to the forming of the first connecting structure.

In the present disclosure, a method for preparing the semiconductor package structure is provided. According to the method, the TSV has an end portion protruding from the back surface of the substrate. Significantly, the end portion of the TSV protrudes from the first passivation layer, and is exposed through the stair-step opening in the second passivation layer. The end portion of the TSV serves as a tenon, and the connecting structure disposed over the TSV can be formed to surround the end portion of the TSV and serve as a mortise. Consequently, the connecting structure is fixed to the TSV due to the tenon-like end portion. Because the connecting structure is fixed to the TSV, the reliability of the semiconductor package structure is improved.

In contrast, with a comparative method, the TSV is entirely embedded in the substrate, the connecting structure may separate from the semiconductor package structure under stress, and the semiconductor package structure suffers from reduced reliability.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
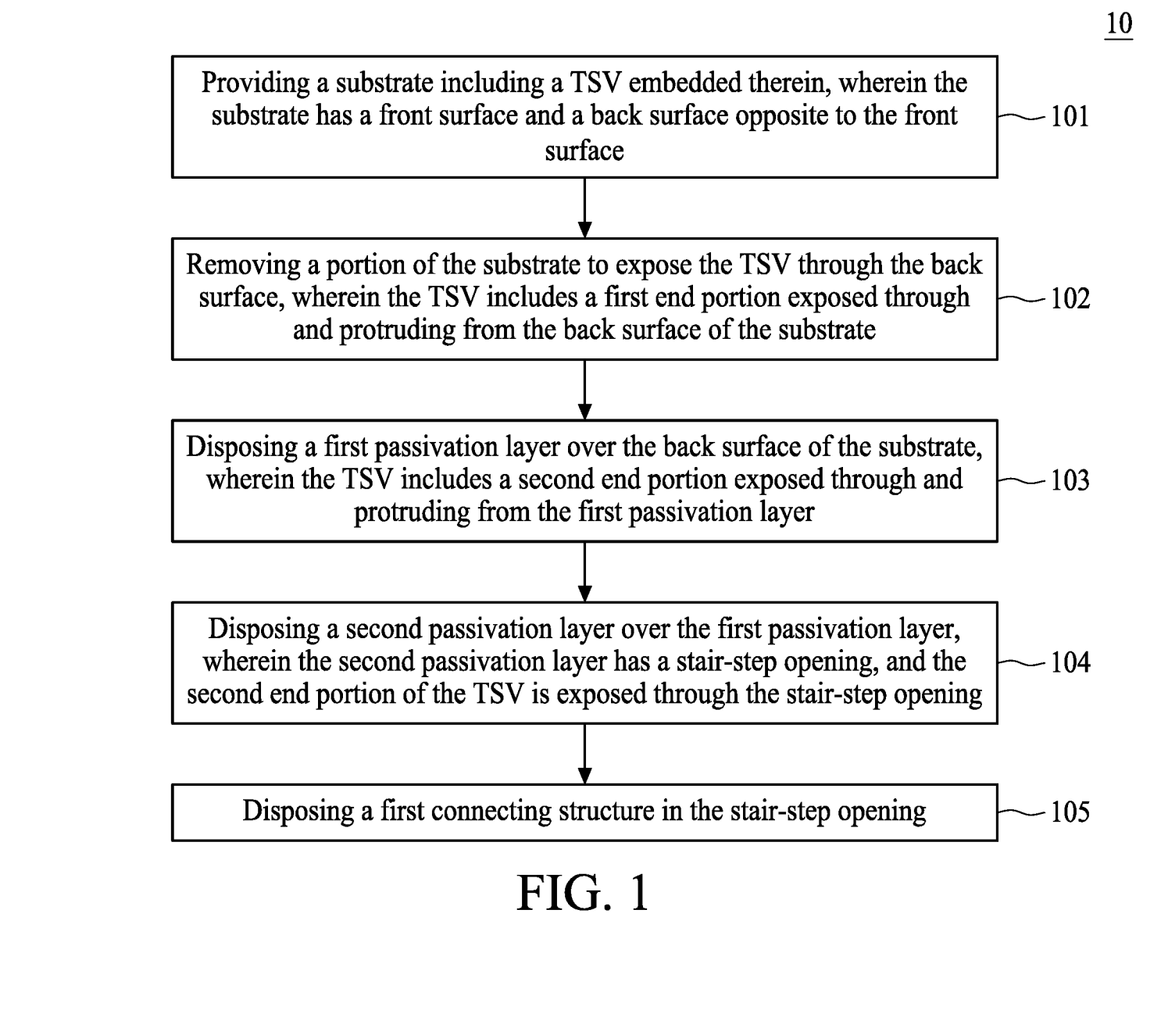
FIG. 1 is a flow diagram illustrating a method for preparing a semiconductor package structure in accordance with some embodiments of the present disclosure.

FIG. 1 is a flow diagram illustrating a method for preparing a semiconductor package structure 10 in accordance with an embodiment of the present disclosure. The method for preparing a semiconductor structure 10 includes a step 101, providing a substrate including a TSV embedded therein. In some embodiments, the substrate has a front surface and a back surface opposite to the front surface. The method 10 further includes a step 102, removing a portion of the substrate to expose the TSV through the back surface. In some embodiments, the TSV includes a first end portion exposed through and protruding from the back surface of the substrate. The method 10 further includes a step 103, disposing a first passivation layer over the back surface of the substrate. In some embodiments, the TSV includes a second end portion exposed through and protruding from the first passivation layer. The method 10 further includes a step 104, disposing a second passivation layer over the first passivation layer. In some embodiments, the second passivation layer has a stair-step opening. The second end portion of the TSV is exposed through the stair-step opening. The method 10 further includes a step 105, disposing a first connecting structure in the stair-step opening. The method for preparing the semiconductor package structure 10 will be further described according to one or more embodiments below.

Figure 2:
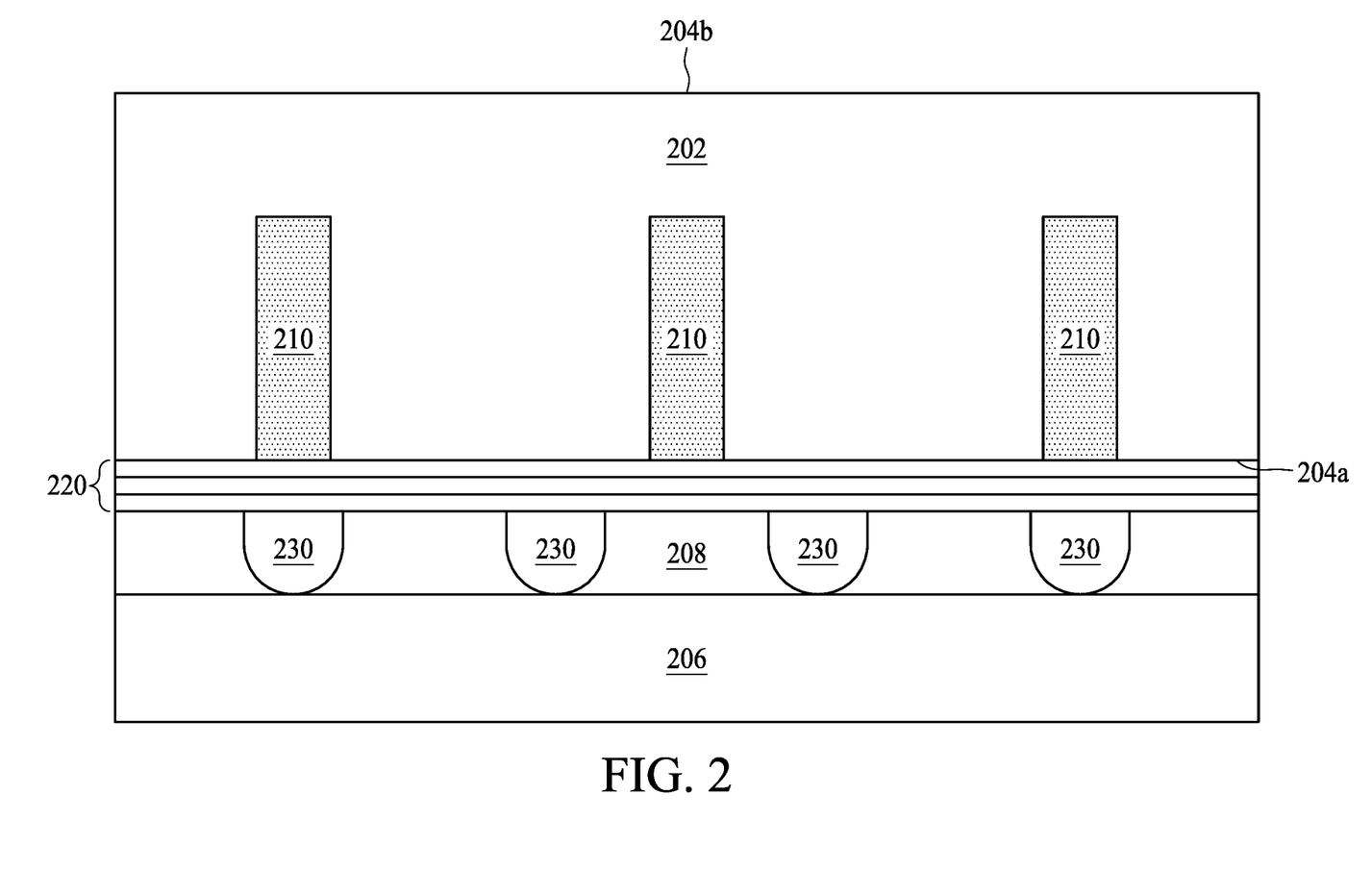
FIGS. 2 to 11 are schematic diagrams illustrating various fabrication stages of the method for preparing the semiconductor package structure in accordance with the embodiment of the present disclosure.

FIGS. 2 to 11 are schematic drawings illustrating various fabrication stages of the method for preparing the semiconductor package structure in accordance with an embodiment of the present disclosure. Referring to FIG. 2, a substrate 202 is provided according to step 101. In some embodiments, the substrate 202 is fabricated with a predetermined functional circuit within the substrate 202 produced by photolithography processes. In some embodiments, the substrate 202 includes a variety of electrical circuits suitable for a particular application. In some embodiments, the electrical circuits include various devices such as transistors, capacitors, resistors, diodes or the like. In some embodiments, the substrate 202 includes any one of various known types of semiconductor devices to form accelerated processing units (APU), central processing units (CPU), graphic processing units (GPU), microprocessors, application-specific integrated circuits (ASICs), digital signal processors (DSPs), or the like.

As shown in FIG. 2, the substrate 202 includes a front surface 204a and a back surface 204b opposite to the front surface 204a. In some embodiments, the front surface 204a is an active surface in which the circuits or electrical components are disposed. In some embodiments, the back surface 204b is an inactive side where the circuits or electrical components are absent.

As shown in FIG. 2, the substrate 202 includes at least a TSV 210 embedded in the substrate 202. In some embodiments, the TSV 210 can be formed by the following steps, but the disclosure is not limited thereto. For example, at least a hole (not shown) is formed in the substrate 202 by an etch method or a laser drill method. Thereafter, conductive material, which can be tungsten (W) or another suitable material, fills the hole to form the TSV 210. In some embodiments, other layers such as a diffusion barrier layer and/or a seed layer that may be required, can be formed before the filling. In some embodiments, the TSV 210 can be disposed within the substrate 202 with only an end surface exposed through the front surface 204a of the substrate 202.

As shown in FIG. 2, in some embodiments, the method 10 further includes disposing an interconnection structure 220 and a connecting structure 230 over the front surface 204a of the substrate 202 after the forming of the TSV 210. In some embodiments, the interconnection structure 220 includes a plurality of dielectric layers and a plurality of interconnect features disposed in the plurality of dielectric layers; however such layers and interconnect features are omitted from FIG. 2 in the interest of brevity. In some embodiments, the interconnect features can include copper (Cu), W or other suitable materials, but the disclosure is not limited thereto. The connecting structure 230 is electrically connected to the circuit and the TSV 210 through the interconnection structure 220.

Still referring to FIG. 2, in some embodiments, the substrate 202 is then attached to a carrier substrate 206. In some embodiments, the substrate 202 is temporarily attached to the carrier substrate 206 by a release film 208. In some embodiments, the release film 208 may be a fluorine-base film, a silicon-coated polyethylene terephthalate film, a polymethylpentene film, a polypropylene film, or other suitable materials, but the disclosure is not limited thereto. In some embodiments, the carrier substrate 206 is configured to support a die, a chip or a package. In some embodiments, the carrier substrate 206 is a semiconductive substrate or a wafer. In some embodiments, the carrier substrate 206 is a silicon wafer, a glass wafer or the like.

Figure 3:
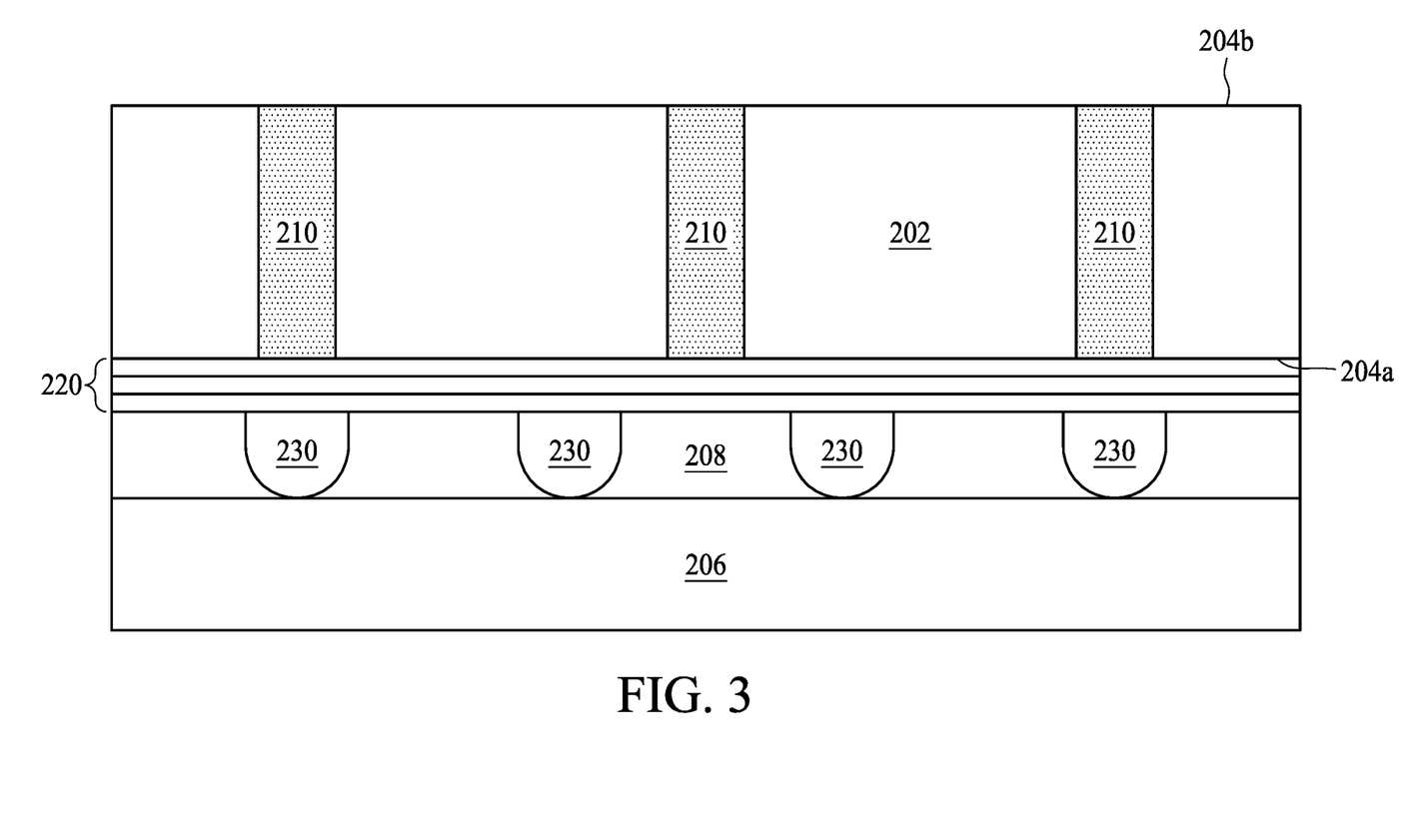
Figure 4:
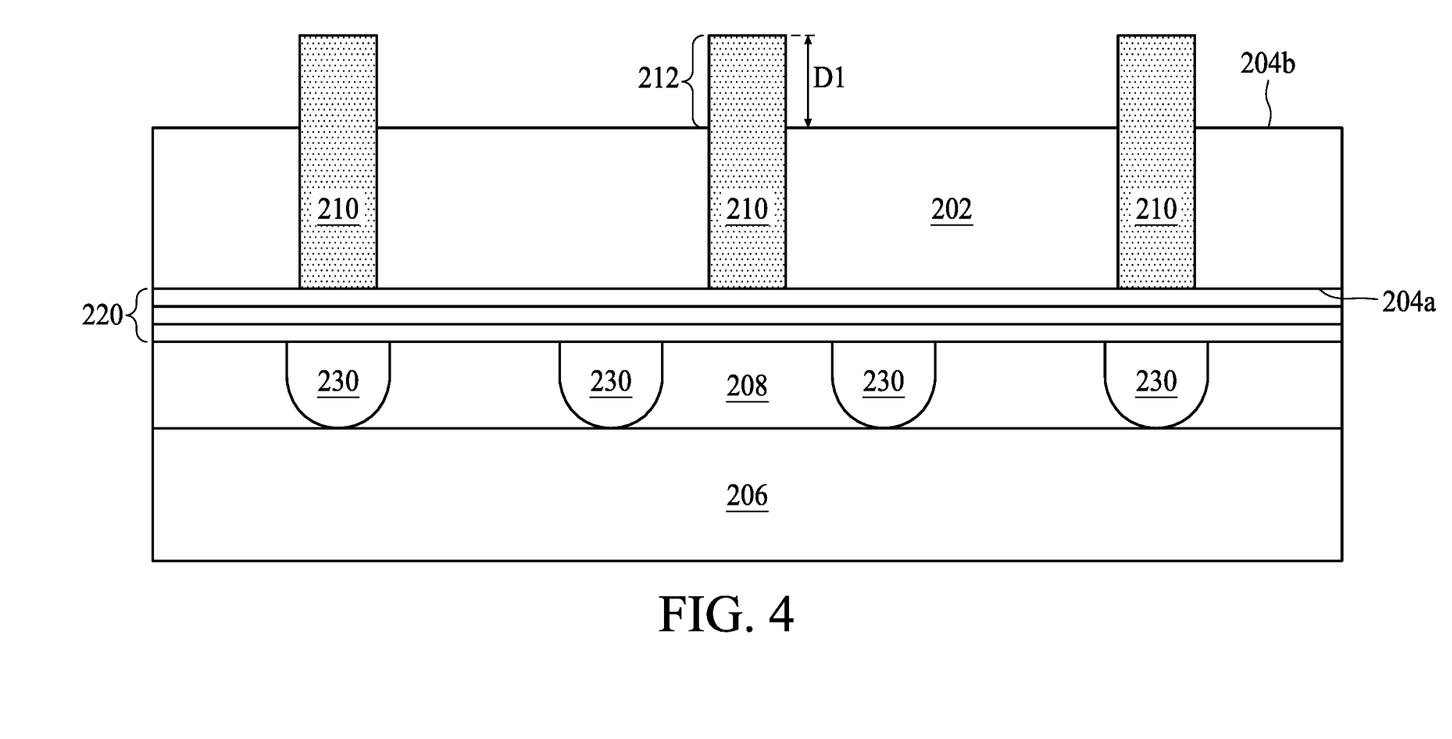

Referring to FIGS. 3 and 4, a portion of the substrate 202 is removed to expose the TSV 210, according to step 102. In some embodiments, step 102 can further include the following steps. The substrate 202 is thinned from the back surface 204. In some embodiments, a thickness of the substrate 202 is reduced. Significantly, the back surface 204b and an end surface of the TSV 210 are coplanar, as shown in FIG. 3. In other words, an end surface of the TSV 210 is in contact with the interconnection structure 220 while the opposite end surface of the TSV 210 is now exposed through the back surface 204b of the substrate 202.

Referring to FIG. 4, in some embodiments, the substrate 202 is etched back on the back surface 204b after the thinning of the substrate 202. For example, a selective etching process is performed on the back surface 204b of the substrate 202 to remove a portion of the substrate 202 until the TSV 210 in the substrate 202 protrudes from the back surface 204b of the substrate 202. The selective etching process in this step may have a significantly higher etching rate on the material of the substrate 202 as compared to an etching rate on the TSV 210, so that the TSV 210 is substantially impervious. As shown in FIG. 4, after the removing of the portion of the substrate 202, a portion of the TSV 210 is exposed through and protrudes from the back surface 204b of the substrate 202. In some embodiments, such portion is defined as a first end portion 212 of the TSV 210. In other words, the TSV 210 includes a first end portion 212 exposed through and protruding from the back surface 204b of the substrate 202, according to step 102. As shown in FIG. 4, a first step height D1 is defined by a surface of the first end portion 212 and the back surface 204b after the removing of the portion of the substrate 202. In some embodiments, the first step height D1 is less than approximately 1 micrometer. In some embodiments, the first step height D1 is between approximately 1 µm and approximately 10 µm, but the disclosure is not limited thereto. For example, the first step height D1 can be approximately 5 µm, but the disclosure is not limited thereto.

Figure 5:
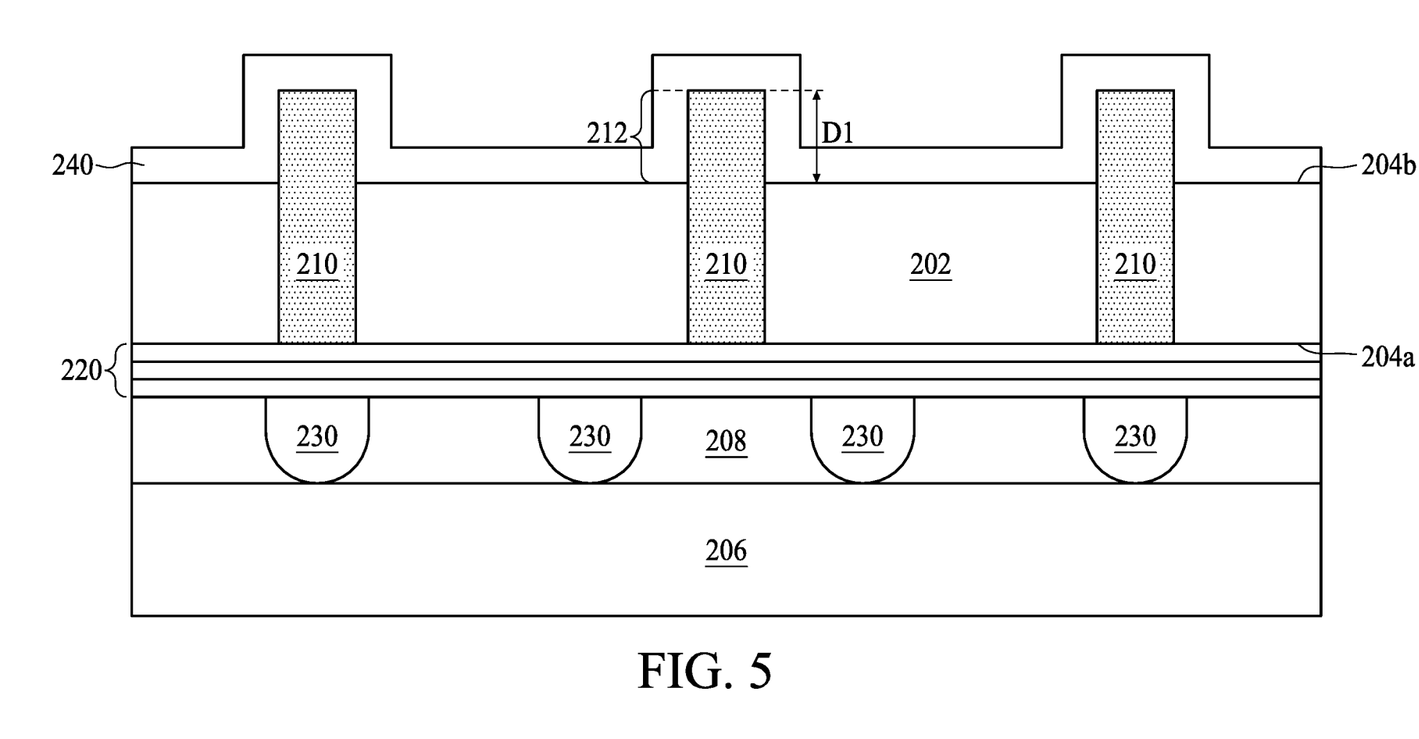
Figure 6:
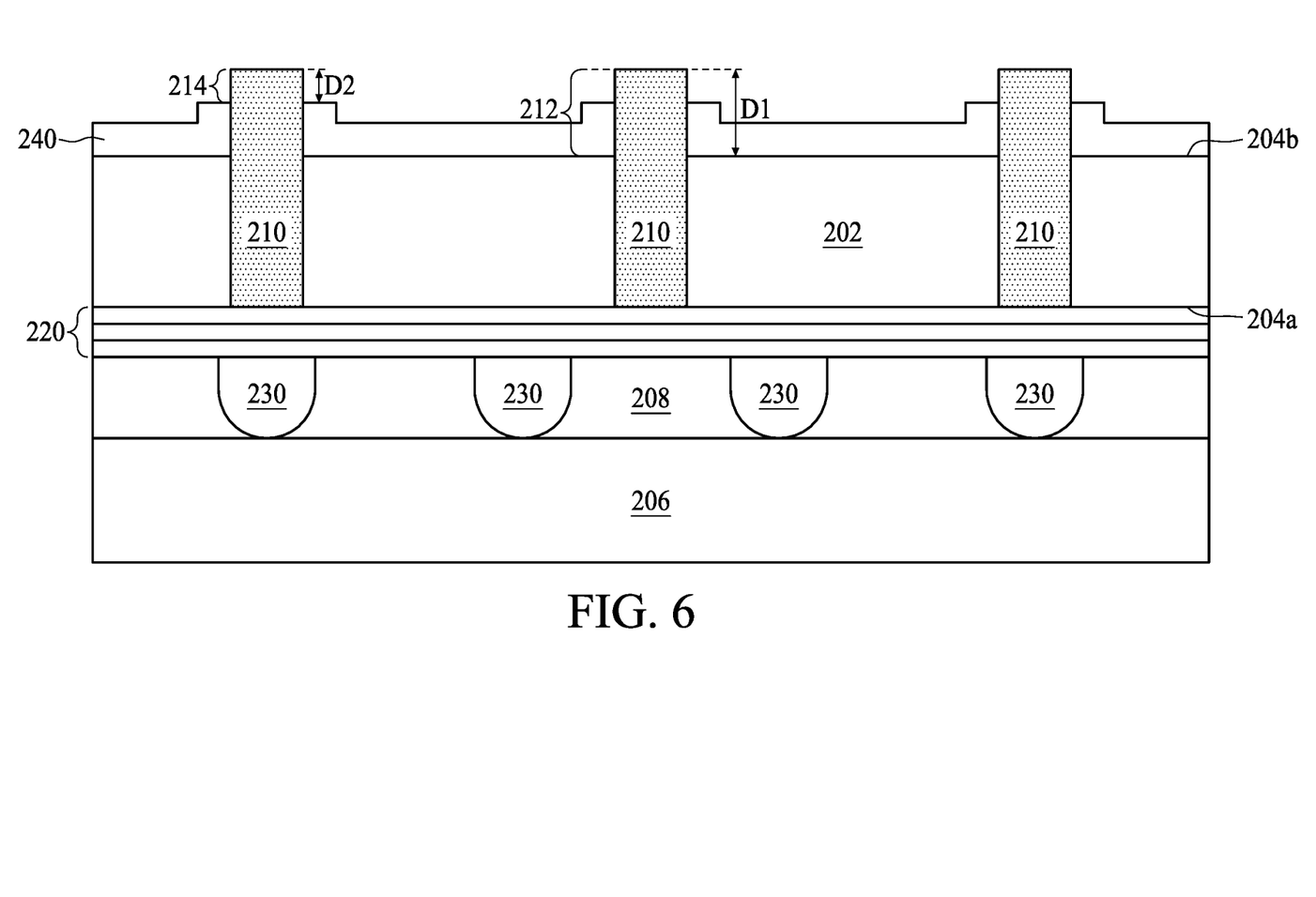

Referring to FIGS. 5 and 6, a first passivation layer 240 is disposed over the back surface 204b of the substrate 202, according to step 103. In some embodiments, step 103 can further include the following steps. As shown in FIG. 5, the first passivation layer 240 is conformally formed over the back surface 204b of the substrate 202 and the first end portion 212 of the TSV 210. The first passivation layer 240 covers and contacts the back surface 204b of the substrate 202, sidewalls of the first end portion 212 and an end surface of the first end portion 212. In some embodiments, the first passivation layer 240 includes inorganic materials, such as silicon nitride (SiN), silicon oxide (SiO) or a combination thereof, but the disclosure is not limited thereto. In some embodiments, a thickness of the first passivation layer 240 is between approximately 0.5 µm and approximately 5 µm, but the disclosure is not limited thereto. For example, the thickness of the first passivation layer 240 can be approximately 1 µm, but the disclosure is not limited thereto.

Referring to FIG. 6, next, a portion of the first passivation layer 240 is removed. For example, a selective etching process is performed on the first passivation layer 240 to remove the portion of the first passivation layer 240 until the TSV 210 protrudes from the first passivation layer 240, as shown in FIG. 6. The selective etching process in this step may have a significantly higher etching rate on the material of the first passivation layer 240 as compared to an etching rate on the TSV 210, so that the TSV 210 is substantially impervious. As shown in FIG. 6, after the removing of the portion of the first passivation layer 240, a portion of the TSV 210 is exposed through and protrudes from the first passivation layer 240. In some embodiments, such portion is defined as a second end portion 214 of the TSV 210. In other words, the TSV 210 includes a second end portion 214 exposed through and protruding from the first passivation layer 240, according to step 103. In some embodiments, a volume of the second end portion 214 is less than a volume of the first end portion 212. As shown in FIG. 6, a second step height D2 is defined by a surface of the second end portion 214 and a top surface of the first passivation layer 240 after the removing of the portion of the first passivation layer 240. The second step height D2 is less than the first step height D1. In some embodiments, the second step height D2 is between approximately 1 µm and approximately 5 μm, but the disclosure is not limited thereto. For example, the second step height D2 can be approximately 2 μm, but the disclosure is not limited thereto.

Figure 7:
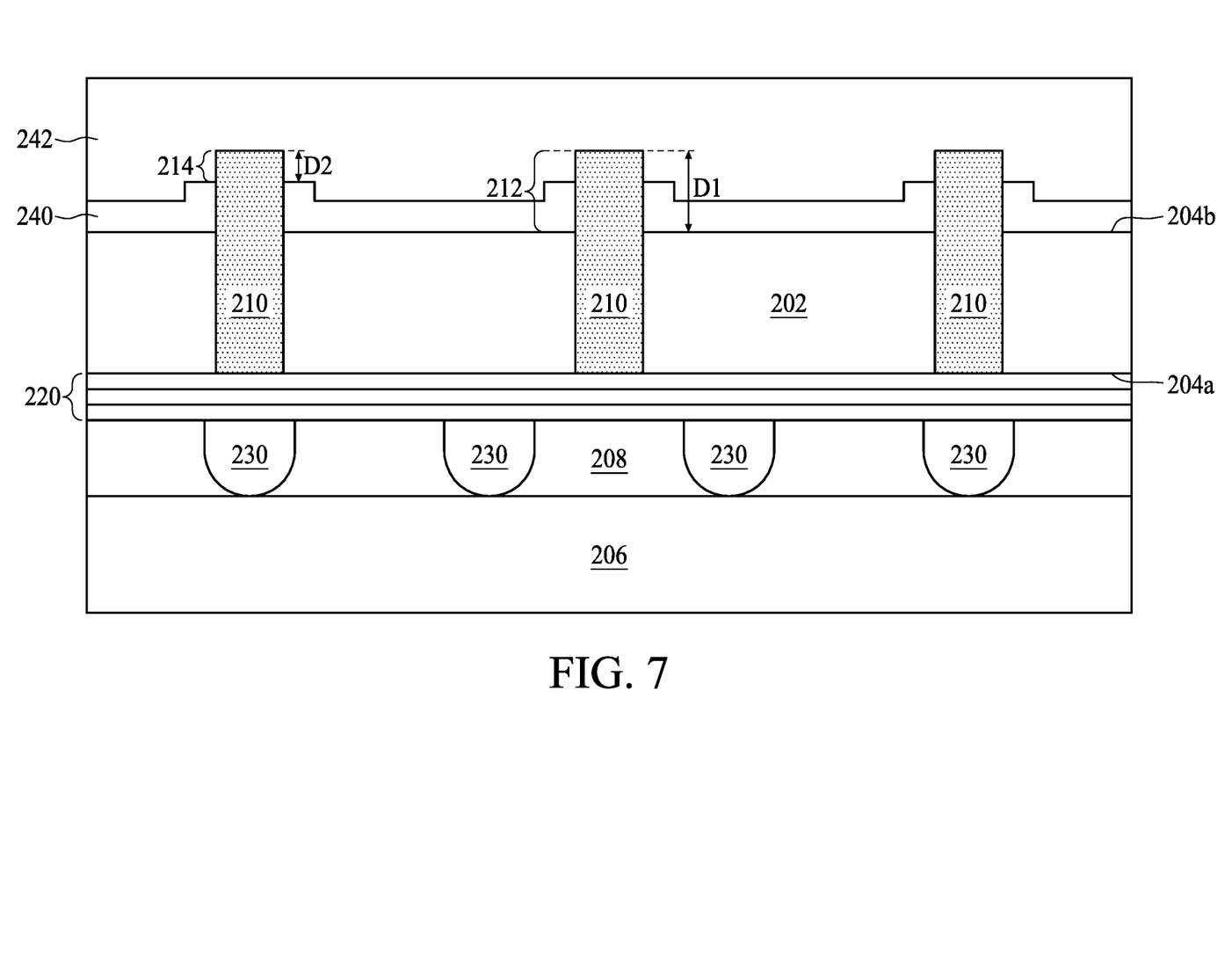
Figure 8:
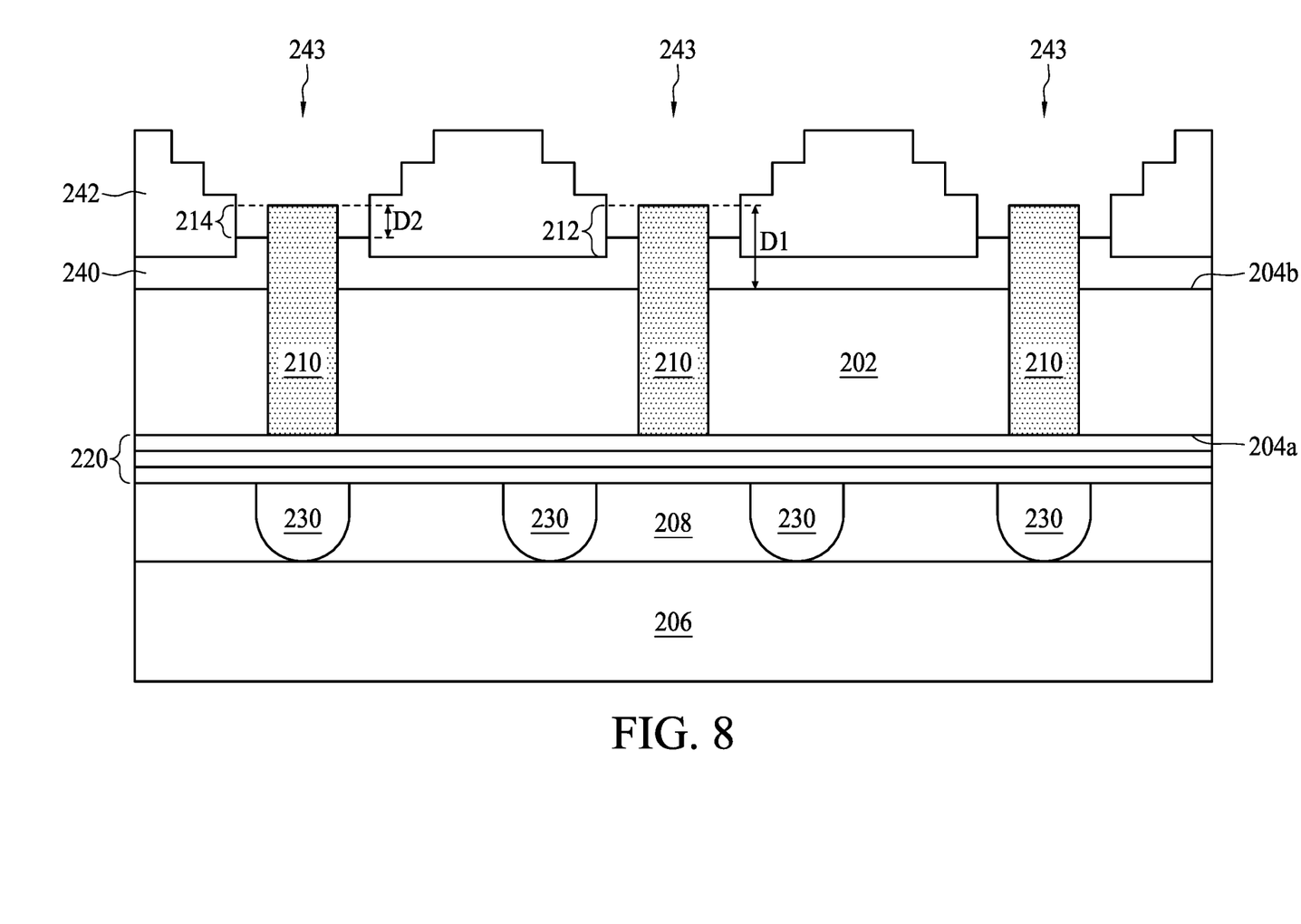

Referring to FIGS. 7 and 8, a second passivation layer 242 is disposed on the first passivation layer 240, according to step 104. In some embodiments, step 104 can further include the following steps. As shown in FIG. 7, the second passivation layer 242 is formed over the first passivation layer 240 and the second end portion 214 of the TSV 210. The second passivation layer 242 covers and contacts the first passivation layer 240, sidewalls of the second end portion 214 and an end surface of the second end portion 214. In some embodiments, the second passivation layer 242 includes organic materials, such as polyimide, but the disclosure is not limited thereto. In some embodiments, a thickness of the second passivation layer 242 is between approximately 2 μm and approximately 10 μm, but the disclosure is not limited thereto. For example, the thickness of the second passivation layer 242 can be approximately 5 μm, but the disclosure is not limited thereto.

Referring to FIG. 8, next, a portion of the second passivation layer 242 is removed. In some embodiments, the portion of the second passivation layer 242 is removed to form a stair-step opening 243, according to step 104. Significantly, the second end portion 214 of the TSV 210 is not only exposed through the stair-step opening 243, but is also separated from the second passivation layer 214, as shown in FIG. 8.

Figure 9:
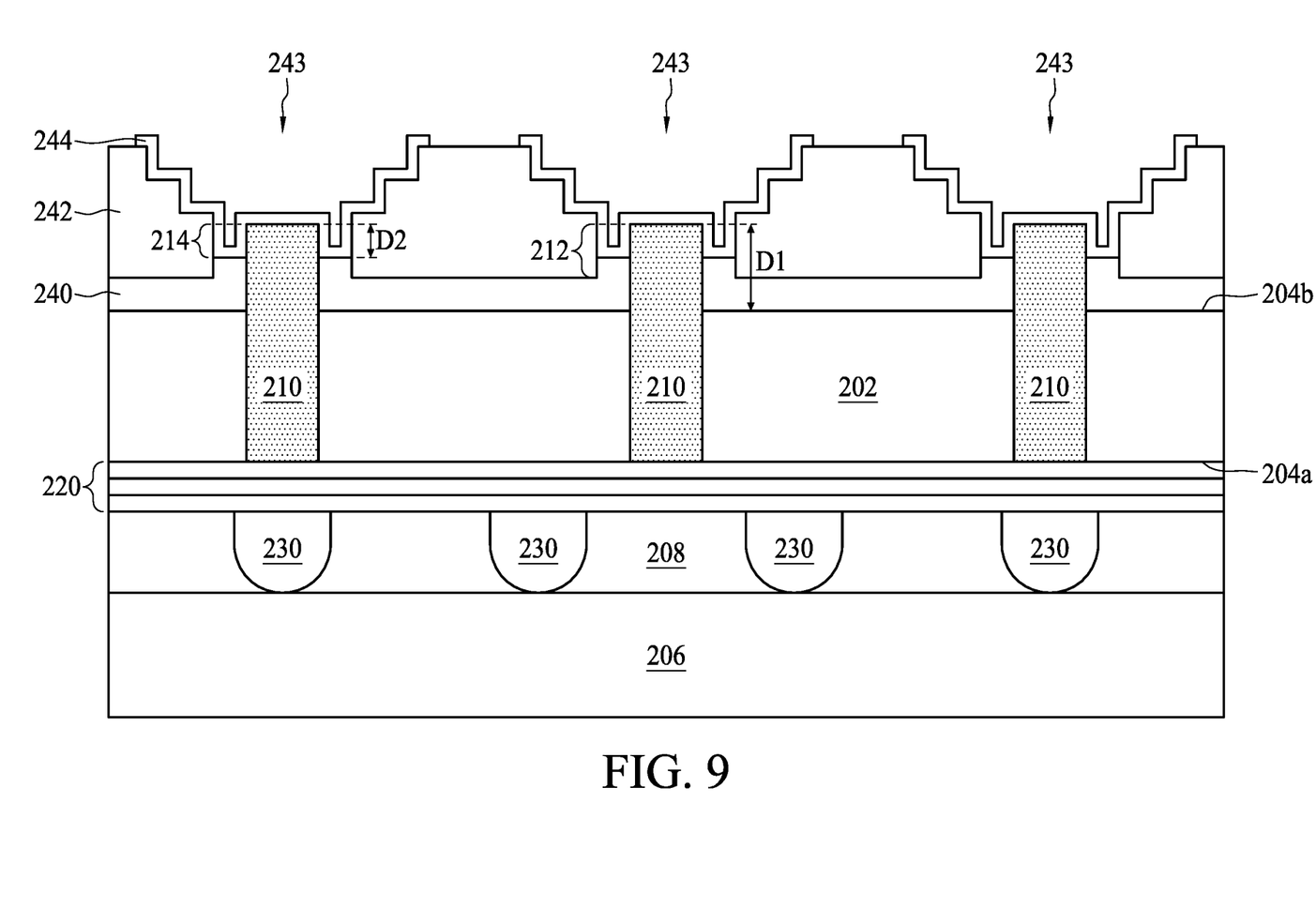

Referring to FIG. 9, a metallic layer 244 can be disposed over a portion of the second passivation layer 242. In some embodiments, the metallic layer 244 is disposed over a portion of the second passivation layer 242 in the stair-step opening 243, as shown in FIG. 9. In some embodiments, the metallic layer 244 is conformally formed in the stair-step opening 243. Significantly, the second end portion 214 exposed through the stair-step opening 243 is covered by the metallic layer 244. In some embodiments, the metallic layer 244 can be an under bump metallization (UBM) 244. The UBM 244 is sputtered or plated over the portion of the second passivation layer 242 in the stair-step opening 243. In some embodiments, the UBM 244 is composed of a single layer or a stack of metal layers of different materials selected from a group consisting of chromium (Cr), Titanium (Ti), Cu, silver (Ag), and a combination thereof.

Figure 10:
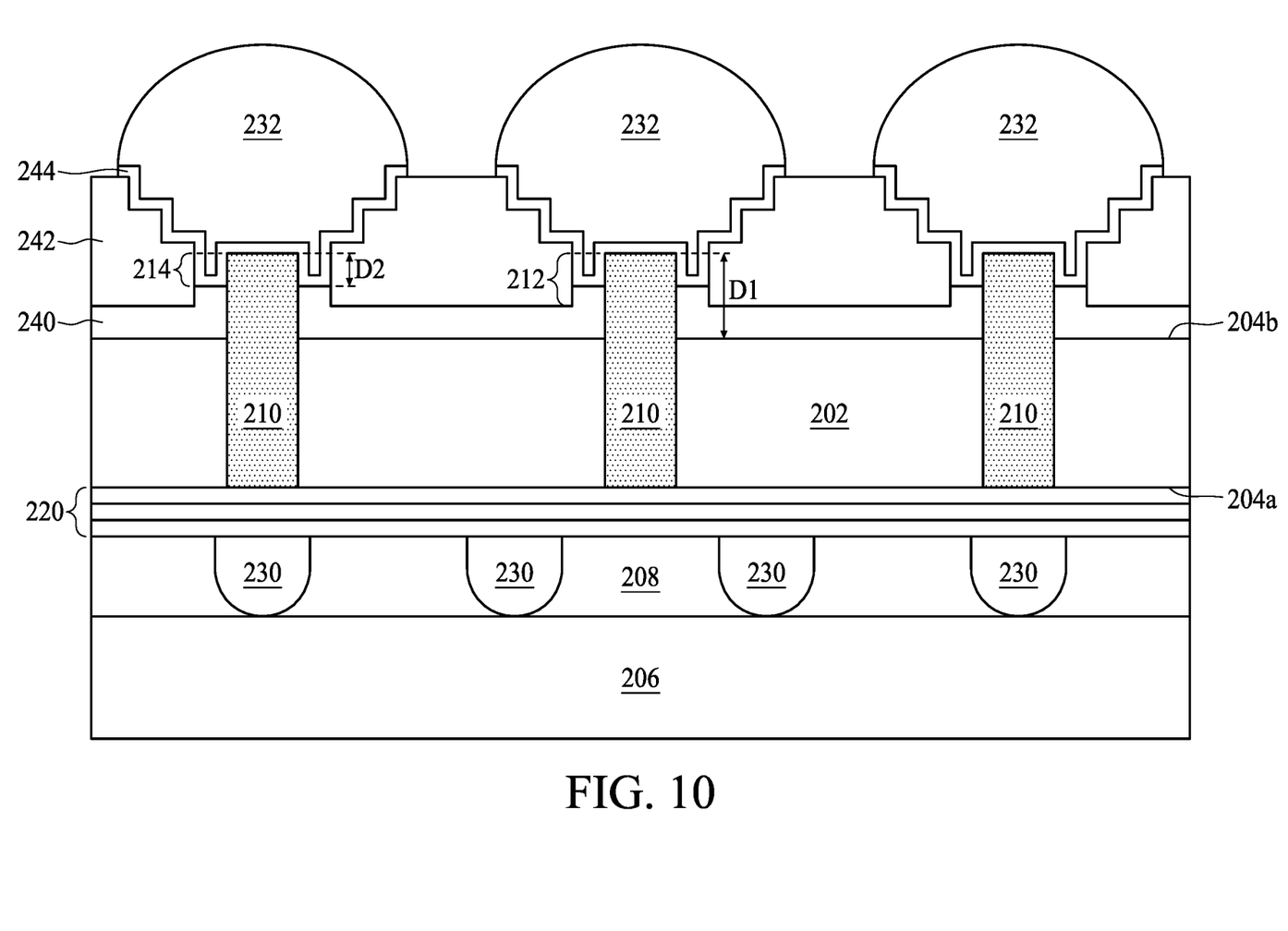

Referring to FIG. 10, a connecting structure 232 can be disposed in the stair-step opening 243, according to step 105. The connecting structure 232 is disposed over a portion of the second passivation layer 242. Specifically, the connecting structure 232 is disposed on the UBM 244 in the stair-step opening 243. In some embodiments, the connecting structure 232 is a conductive bump, which includes conductive material such as solder, Cu, nickel (Ni), or gold (Au), but the disclosure is not limited thereto. In some embodiments, the connecting structure 232 is a solder ball, a ball grid array (BGA) ball, a controlled collapse chip connection (C4) bump, a microbump, or a pillar, but the disclosure is not limited thereto. In some embodiments, the connecting structure 232 can have a spherical, hemispherical or cylindrical shape, but the disclosure is not limited thereto.

As shown in FIG. 10, the connecting structure 232 and the UBM 244 surround the second end portion 214 exposed through the stair-step opening 243. Significantly, the second end portion 214 of the TSV 210 serves as a tenon such that the connecting structure 232 and the UBM 244 can be fixed to the tenon-like second end portion 214 of the TSV 210.

Figure 11:
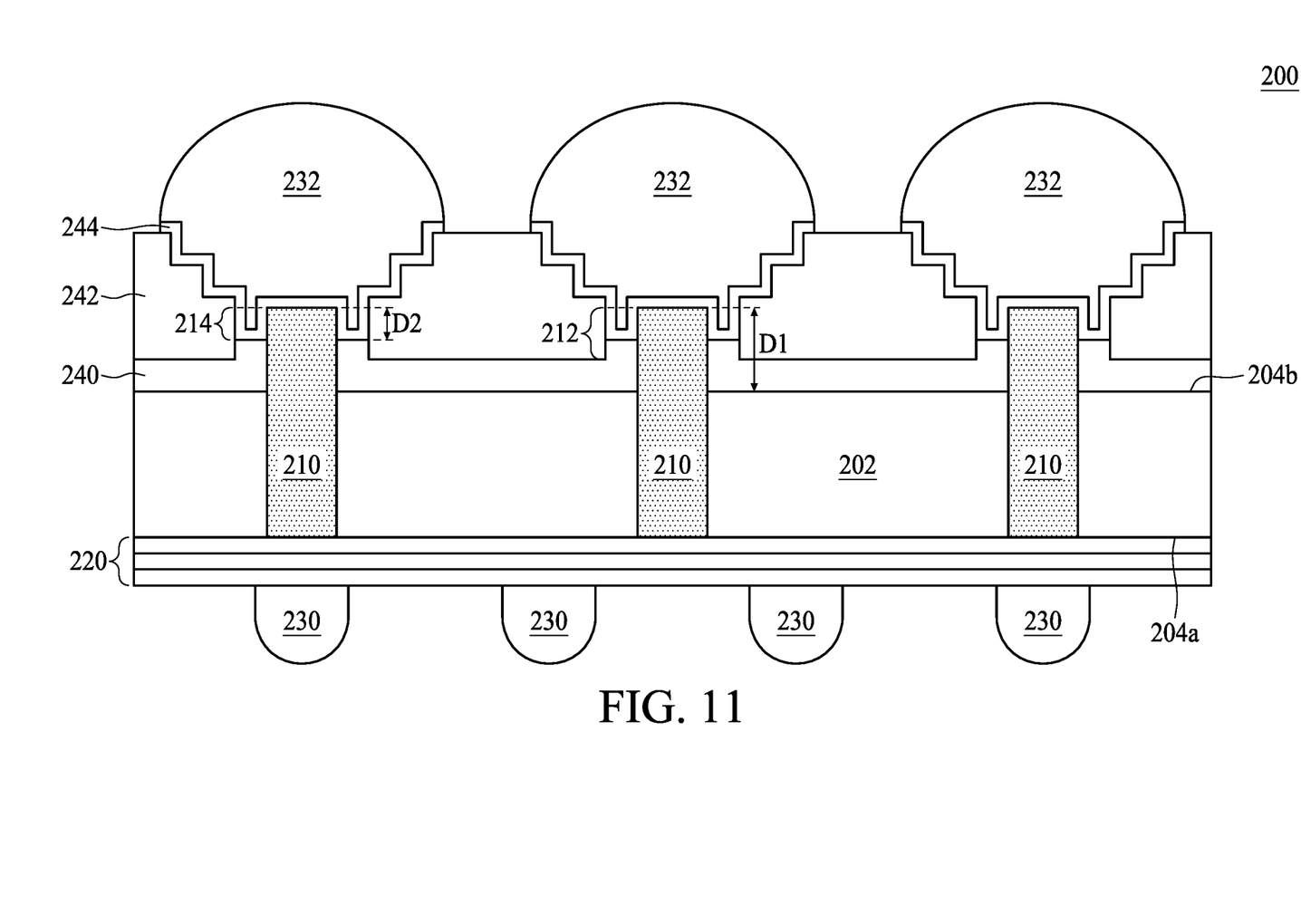

Referring to FIG. 11, after the forming of the connecting structure 232, the substrate 202 is singulated and detached from the carrier substrate 206, and thus a semiconductor package structure 200 is obtained.

As shown in FIG. 11, the semiconductor package structure 200 includes a substrate 202 having a front surface 204a and a back surface 204b opposite to the front surface 204a, an interconnection structure 220 disposed over the front surface 204a of the substrate 202, a first passivation layer 240 disposed over the back surface 204b of the substrate 202, a second passivation layer 242 disposed over the first passivation layer 240, and a TSV 210 disposed in the substrate 202. In some embodiments, the TSV 210 penetrates the substrate 202 from the back surface 204b to the front surface 204a. Further, the TSV 210 has an end portion 214 protruding from the first passivation layer 240 and separated from the second passivation layer 242. In some embodiments, the first passivation layer 240 is in contact with a portion of sidewalls of the TSV 210.

As shown in FIG. 11, a length of the TSV 210 is greater than a thickness of the substrate 202. Further, a difference D1 between the length of the TSV 210 and the thickness of the substrate 202 is less than 1 μm. In some embodiments, the difference D1 is between approximately 1 μm and approximately 10 μm, but the disclosure is not limited thereto. For example, the difference D1 can be approximately 5 μm, but the disclosure is not limited thereto. A step height D2 is defined as a difference between a surface of the end portion 214 of the TSV 210 and a top surface of the first passivation layer 240. In some embodiments, the step height D2 is between approximately 1 μm and approximately 5 μm, but the disclosure is not limited thereto. For example, the step height D2 can be approximately 2 μm, but the disclosure is not limited thereto.

The semiconductor package structure 200 further includes a connecting structure 230 disposed over the interconnection structure 220, and a connecting structure 232 disposed over the second passivation layer 242. The connecting structure 230 is electrically connected to the interconnection structure 220, the interconnection structure 220 is electrically connected to the TSV 210, and the connecting structure 232 is electrically connected to the TSV 210. Accordingly, the connecting structure 230 and the connecting structure 232 are electrically connected through the TSV 210 and the interconnection structure 220. In other words, the TSV 210 provides vertical connection between the back surface 204b and the front surface 204a of the substrate 202.

Still referring to FIG. 11, the second passivation layer 242 includes a stair-step shape. In some embodiments, the semiconductor package structure 200 further includes a metallic layer 244 serving as a UBM and disposed in the stair-step opening, and the connecting structure 232 is disposed on the UBM. In other words, the metallic layer 244 is disposed between the connecting structure 232 and the TSV 210, and between the connecting structure 232 and the second passivation layer 242. A space is formed between the second passivation layer 242 and the end portion 214 of the TSV 210 in the stair-step opening. In some embodiments, the space is filled with the metallic layer 244. In other embodiments, the space is filled with the metallic layer 244 and the connecting structure 232, as shown in FIG. 11. Accordingly, the metallic layer 244 and the connecting structure 232 surround the end portion 214 of the TSV 210.

In the present disclosure, a method for preparing the semiconductor package structure 10 is provided. According to the method 10, the TSV 210 has the end portion 214 protruding from the back surface 204b of the substrate 202. Significantly, the end portion 214 of the TSV 210 protrudes from the first passivation layer 240, and is exposed through the stair-step opening in the second passivation layer 242. The end portion 214 of the TSV 210 serves as a tenon, and the connecting structure 232 disposed over the TSV 210 can be formed to surround the end portion 214 of the TSV 210. Consequently, the connecting structure 232 is fixed to the TSV 210 due to the tenon-like end portion 214. Because the connecting structure 232 is fixed to the TSV 210, the reliability of the semiconductor package structure 200 is improved.

In contrast, with a comparative method, the TSV is entirely embedded in the substrate, the connecting structure may fall from the semiconductor package structure under stress, and the semiconductor package structure suffers from reduced reliability.

One aspect of the present disclosure provides a semiconductor package structure. The semiconductor package structure includes a substrate having a front surface and a back surface opposite to the front surface, an interconnection structure disposed over the front surface of the substrate, a first passivation layer disposed over the back surface of the substrate, a second passivation layer disposed over the first passivation layer, and a TSV disposed in the substrate. In some embodiments, the TSV structure penetrates the substrate from the back surface of the substrate to the front surface of the substrate. In some embodiments, the TSV has an end portion protruding from the first passivation layer and separated from the second passivation layer.

One aspect of the present disclosure provides a method for preparing a semiconductor package structure. The method includes the following steps. A substrate is provided. In some embodiments, the substrate includes a TSV embedded therein. The substrate has a front surface and a back surface opposite to the front surface. A portion of the substrate is removed to expose the TSV through the back surface. In some embodiments, the TSV includes a first end portion exposed through and protruding from the back surface of the substrate. A first passivation layer is disposed over the back surface of the substrate. In some embodiments, the TSV includes a second end portion exposed through and protruding from the first passivation layer. A second passivation layer is disposed over the first passivation layer. In some embodiments, the second passivation layer has a stair-step opening, and the second end portion of the TSV is exposed through the stair-step opening. A first connecting structure is disposed in the stair-step opening.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor package structure, comprising:
    a substrate having a front surface and a back surface opposite to the front surface;
    an interconnection structure disposed over the front surface of the substrate;
    a first passivation layer disposed over the back surface of the substrate;
    a second passivation layer disposed over the first passivation layer; and
    a through silicon via (TSV) disposed in the substrate; and
    a metallic layer disposed over the TSV,
    wherein the TSV penetrates the substrate from the back surface to the front surface, and the TSV has an end portion protruding from the first passivation layer and separated from the second passivation layer;
    wherein the metallic layer covers and contacts a top surface and sidewalls of the end portion of the TSV.

2. The semiconductor package structure of claim 1, wherein a length of the TSV is greater than a thickness of the substrate.

3. The semiconductor package structure of claim 2, wherein a difference between the length of the TSV and the thickness of the substrate is between approximately 1 micrometer and approximately 10 μm.

4. The semiconductor package structure of claim 1, wherein the TSV is electrically connected to the interconnection structure.

5. The semiconductor package structure of claim 1, further comprising a first connecting structure disposed over the interconnection structure.

6. The semiconductor package structure of claim 1, wherein the first passivation layer is in contact with a portion of sidewalls of the TSV.

7. The semiconductor package structure of claim 1, wherein a step height is defined by a surface of the end portion of the TSV and a top surface of the first passivation layer.

8. The semiconductor package structure of claim 1, wherein the second passivation layer comprising a stair-step opening.

9. The semiconductor package structure of claim 1, further comprising a second connecting structure disposed over the second passivation layer and the TSV.

10. The semiconductor package structure of claim 9, wherein the metallic layer is disposed between the TSV and the second connecting structure.

11. The semiconductor package structure of claim 10, wherein the metallic layer and the second connecting structure surround the end portion of the TSV.

* * * * *